United States Patent
Mobley et al.

(10) Patent No.: US 7,405,634 B2
(45) Date of Patent: Jul. 29, 2008

(54) METHOD FOR ALTERING THE DELAY PROPERTIES OF A TRANSMISSION LINE USING COMPENSATION TABS

(75) Inventors: James B. Mobley, Austin, TX (US); Robert Washburn, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 688 days.

(21) Appl. No.: 10/769,060

(22) Filed: Jan. 30, 2004

(65) Prior Publication Data

US 2005/0170691 A1 Aug. 4, 2005

(51) Int. Cl.
*H01P 3/08* (2006.01)

(52) U.S. Cl. .................. 333/1; 333/4; 333/246

(58) Field of Classification Search ............ 333/1, 333/4, 5, 161, 246
See application file for complete search history.

(56) References Cited

U.S. PATENT DOCUMENTS

| | | | |
|---|---|---|---|
| 5,278,524 A * | 1/1994 | Mullen | 333/1 |
| 5,448,208 A * | 9/1995 | Honjo | 333/128 |
| 5,777,532 A * | 7/1998 | Lakin | 333/161 |
| 6,280,555 B1 | 8/2001 | Wilbur | 205/125 |
| 6,347,041 B1 * | 2/2002 | Hailey et al. | 361/777 |
| 6,582,581 B1 | 6/2003 | Goldberg | 205/125 |
| 6,940,362 B2 * | 9/2005 | Otaki et al. | 333/33 |

* cited by examiner

*Primary Examiner*—Benny Lee
(74) *Attorney, Agent, or Firm*—Hamilton & Terrile, LLP; Gary W. Hamilton

(57) ABSTRACT

An improved method and apparatus for altering the effective electrical length of trace on a circuit board. In the present invention small tabs of etch are routed perpendicular to the trace in the unused areas between adjacent traces. In an embodiment of the invention, a method of tuning the delay characteristics of a transmission line is implemented by inserting compensation tabs into the unused area between the segments of adjacent straight traces or a serpentine run. Utilizing the method and apparatus of the present invention, it is possible to achieve significantly greater electrical length for an electrical trace without introducing coupling problems or utilizing large amounts of space on a circuit board.

8 Claims, 3 Drawing Sheets

METHOD FOR ALTERING THE DELAY PROPERTIES OF A TRANSMISSION LINE USING COMPENSATION TABS

BACKGROUND OF THE INVENTION

1. Field of the Invention

The present invention relates generally to circuit boards used in information handling systems. More specifically, the present invention provides a method and apparatus for improving performance in conductor traces used in circuit boards in information handling systems.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As computers have increased in performance, it has become necessary to use higher data bit rates in high-density circuitry with minimal spacing between the various circuit conductors. As a result, it has become difficult to fabricate circuit boards that meet the needs of high performance computing technology using conventional circuit board manufacturing methods. The necessity for a more ideal transmission path vital to higher-performance electrical signals is in direct conflict with the minimization of both cost and size.

Many of today's high speed busses require routed signals to travel from source to destination with minimal skew introduced by the interconnect. The process by which this is achieved is called "length matching" where any two or more signals are routed through conductors having the same physical length from source to destination. This practice is also becoming more commonplace on the chip package substrate.

One method for trace length matching is called "serpentining," wherein extra length is added to signals that have a shorter physical distance from point A to B than their counterparts. Generally, due to the limited amount of routing real estate available, most serpentine routes are "tight" in that these parallel trace segments are spaced at a distance two to three times the width of the trace. One problem with this approach is that a serpentine trace does not have the same "electrical length" as a straight trace of equivalent physical length. As used herein, "electrical length" will be understood by those of skill in the art to refer to the electrical transmission characteristics of a straight conductor having a predetermined width and length. With regard to the "electrical length" of a serpentine-pattern conductor, even though serpentine trace contains the same length of conductor material as a straight trace, it does not exhibit the same electrical transmission properties; therefore, it does not have the same "electrical length" as the straight trace for purposes of "length matching" to control skew and other signal propagation issues. The mutual inductance and capacitance of the parallel segments creates a self-coupling mechanism which causes a signal on a serpentine trace to propagate faster than it would otherwise on a straight trace. Another problem with this approach is that a serpentine consumes significantly more routing real estate than a straight trace.

Prior methods for altering the electrical length of a trace have been limited to: 1) making the trace physically longer; 2) adding discrete components such as series resistors, capacitors or vias to slow the edge rate, thereby increasing flight time; and 3) routing some combination of stripline and microstrip materials which have different propagation delay characteristics for an equivalent length of trace.

The problems inherent in these approaches relate to the tradeoffs required to achieve the desired results. Lengthening traces beyond a certain point without introducing coupling problems or utilizing more space may not be an option for compact designs. This is especially true for chip package substrate routing. Adding discrete components can create lumped impedance discontinuities and degrade signal slew rates. In view of the shortcomings of the prior art, there is a need for an improved method and apparatus for altering the effective electrical length of trace on a circuit board.

SUMMARY OF THE INVENTION

The present invention overcomes the shortcomings of the prior art by providing a method and apparatus for forming a circuit trace that has greater "electrical length" than a comparable straight circuit trace having the same total physical conductor length. In the present invention, small tabs (sometimes referred to herein as "compensation tabs") are formed on a conductor at predetermined locations thereon to increase its effective "electrical length." In one embodiment, the compensation tabs are perpendicular to the longitudinal axis of the conductor trace. In alternate embodiments of the invention, however, the tabs can be placed a various angles with respect to the longitudinal axis of the conductor trace. Using the method of the present invention, the delay characteristics of a conductor or transmission line is implemented by inserting compensation tabs of a predetermined geometry into the unused area between the parallel segments of adjacent straight traces or a serpentine run.

The method and apparatus of the present invention has the following advantages: 1) no extra routing real estate is required to make the trace behave electrically longer; 2) the routing real estate required can actually be reduced due to the fact that traces without compensation tab tuning will require more serpentine turns to achieve the same equivalent "electrical length;" and 3) due to its distributed nature, this method does not appreciably degrade the signal slew rate or disrupt signal fidelity.

Utilizing the method and apparatus of the present invention, it is possible to achieve significantly greater "electrical length" for an conductor trace without introducing coupling problems or utilizing large amounts of space, which may not be an option for compact designs.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION OF THE PREFERRED EMBODIMENTS

Figure 1A:
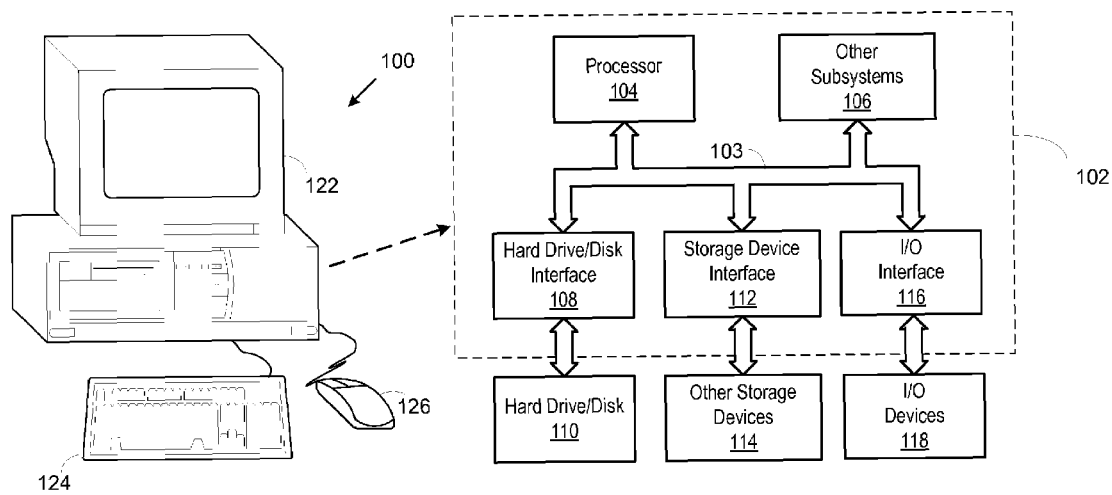
FIG. 1A is a general illustration of components of an information handling system containing circuit boards implementing the method and apparatus of the present invention for increasing routing density of signal conductors on a printed circuit board.

The method and apparatus of the present invention provides significant improvements in the manufacture and use of circuit boards such as those used in an information handling system 100 shown in FIG. 1A. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring to FIG. 1A, the information handling system 100 includes a main system board 102 that comprises a processor 104 and various other subsystems 106 understood by those skilled in the art. Data is transferred between the various system components via various data buses illustrated generally by bus 103. A hard drive 110 is controlled by a hard drive/disk interface 108 that is operably connected to the hard drive/disk 110. Likewise, data transfer between the system components and other storage devices 114 is controlled by storage device interface 112 that is operably connected to the various other storage devices 114, such as CD ROM drives, floppy drives, etc. An input/output (I/O) interface 118 controls the transfer of data between the various system components and a plurality of input/output (I/O) devices, such as a display 122, a keyboard 124, a mouse 126.

Figure 1B:
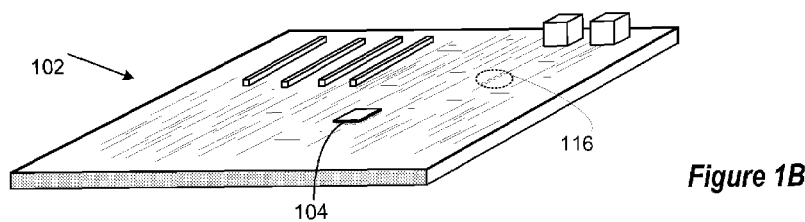
FIG. 1B is a general illustration of an information handling system circuit board implementing the method and apparatus of the present invention for increasing the effective electrical length of a circuit trace.

FIG. 1B is a generalized illustration of a printed circuit board such as system board (or motherboard) 102 discussed above in connection with FIG. 1A. Circuit boards, such as the circuit board 102 shown in FIG. 1B, often employ circuit traces having a pattern to increase the effective electrical length of the trace. A circuit trace having a pattern, such as a serpentine pattern, to increase the effective electrical length of the trace is illustrated generally by reference numeral 116.

Figure 2:
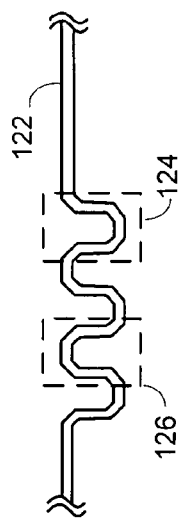
FIG. 2 is an illustration of a prior art circuit trace having a serpentine pattern for increasing the effective electrical length of the trace.

FIG. 2 is an illustration of a prior art circuit trace 122 having a serpentine pattern for increasing the effective electrical length of the trace. As can be seen, the serpentine pattern comprises a plurality of U-shaped patterns in an alternating sequence of "upright" and "inverted" U-shaped trace portions illustrated by reference numerals 124 and 126, respectively. Although the serpentine pattern illustrated in FIG. 2 can be used to increase the effective electrical length of the trace 122, the pattern is inefficient in terms of the amount of circuit board space required and is unsuitable for extremely compact circuit board designs. As discussed hereinabove, the serpentine design illustrated in FIG. 2 does not have the same electrical length as a straight trace of equivalent physical length. The mutual inductance and capacitance of the parallel segments of the U-shaped patterns creates a self-coupling mechanism which causes a signal on a serpentine trace to propagate faster than it would otherwise on a straight trace.

Figure 3:
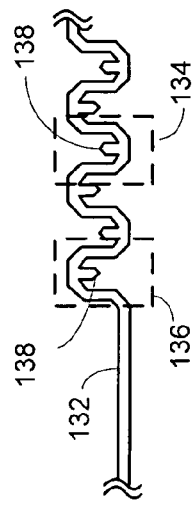
FIG. 3 is an illustration of an embodiment of a circuit trace of the present invention implementing a serpentine pattern having a plurality of tabs for increasing the effective electrical length of the circuit trace.

FIG. 3 is an illustration of an embodiment of a circuit trace 132 of the present invention implementing an improved serpentine pattern for increasing the effective electrical length of the trace. The trace comprises a serpentine pattern comprising a plurality of U-shaped patterns in an alternating sequence of "upright" and "inverted" U-shaped trace portions illustrated by reference numerals 134 and 136, respectively. Unlike the prior art serpentine pattern, however, each of the U-shaped portions of the serpentine patterns comprise a tab 138 in the interior portion of the U-shaped pattern. The tabs 138 serve to increase the effective electrical length of the trace 122 far beyond the increase yielded with the prior art serpentine design illustrated in FIG. 2. In addition, as discussed in greater detail below, the trace on the present invention as illustrated in FIG. 3 has signal propagation properties substantially the same as a straight trace of the same physical length.

Figure 4:
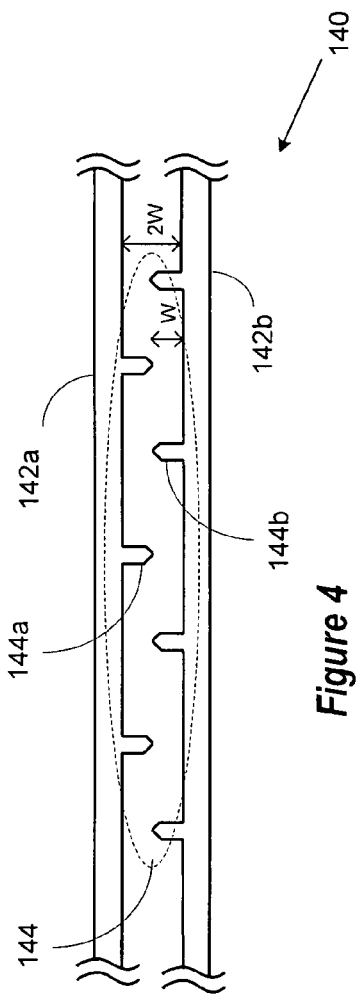
FIG. 4 is an illustration of another embodiment of the present invention comprising a linear circuit trace with a plurality of perpendicular tabs for increasing the effective electrical length of the circuit trace.

FIG. 4 is an illustration of circuit traces 140 comprising another embodiment of the present invention comprising a pair of linear circuit traces 142a and 142b. Each of the circuit traces 142a and 142b comprises a plurality of tabs 144 for increasing the effective electrical length of the respective traces. As can be seen in FIG. 4, the perpendicular tabs 144 are aligned in an interleaved pattern in the interior of a channel defined by the circuit traces 142a and 142b. Although the embodiment illustrated in FIG. 4 comprises a pair of traces with perpendicular tabs, it will be understood by those of skill in the art that the benefits of the compensation tabs can be used on a single trace, such as trace 142b to provide increased effective electrical length for the trace.

While the benefits of the present invention can be realized using compensation tabs having various dimensions and spacing, effective results can be obtained using a tab having a width (W) equal to the width of the circuit trace. Likewise, the lateral spacing between the various tabs on a conductor and the spacing between interleaved tabs, such as the tabs 144a and 144b can have various spacing widths to achieve particular performance results. Effective results using the present invention can be achieved using interleaved tabs that have a lateral spacing of 2W, where W represents the width of the conductor trace, as discussed hereinabove.

The benefits of the present invention are 1) no extra routing real estate is required to make the trace behave electrically longer; 2) the routing real estate required can actually be reduced due to the fact that traces without compensation tab tuning will require more serpentine turns to achieve the same equivalent electrical length; and 3) due to its distributed nature, this method does not appreciably degrade the signal slew rate or disrupt signal fidelity.

The present invention can be implemented using fabrication techniques for forming conductors on circuit boards well understood by those of skill in the art. Representative fabrication techniques, as well as the background of technology in this field of the art, are discussed in U.S. Pat. No. 6,582,581 entitled "Sequential Build Circuit Board Plating Project," issued to Goldberg on Jun. 24, 2003 and U.S. Pat. No. 6,280,555, entitled "Method of Forming a Printed Circuit Board," issued to Wilbur on Aug. 28, 2001. Each of the aforementioned references are hereby incorporated by reference herein for all purposes.

The method and apparatus of the present invention has been verified by using a time-domain reflectometry (TDR) on testboards to show that a serpentine trace propagates faster than a straight trace of equal length. Rigorous simulation work has been performed on these scenarios and these trends correlate well with physical lab measurements and field theory analysis.

To model the effects of distributed compensation tables on the transmission line, simulation models were built using a 2D field solver which accurately predicts all of the coupling mechanisms between parallel trace and compensation tab segments. The experiment compared four traces, illustrated in FIG. 5 by reference numerals 1-4, with four different routing strategies all at an equal length of three inches from end to end. Of the three inches, only one inch of each trace contained serpentine bends, compensation tabs or a combination of both while the straight trace, trace #2, was modeled as perfectly straight. The traces were 5 mil side 50 ohm microstrip terminated into a matched 50 ohm load and excited with a signal swing of 1V and a rise time of 75 picoseconds.

Figure 5:
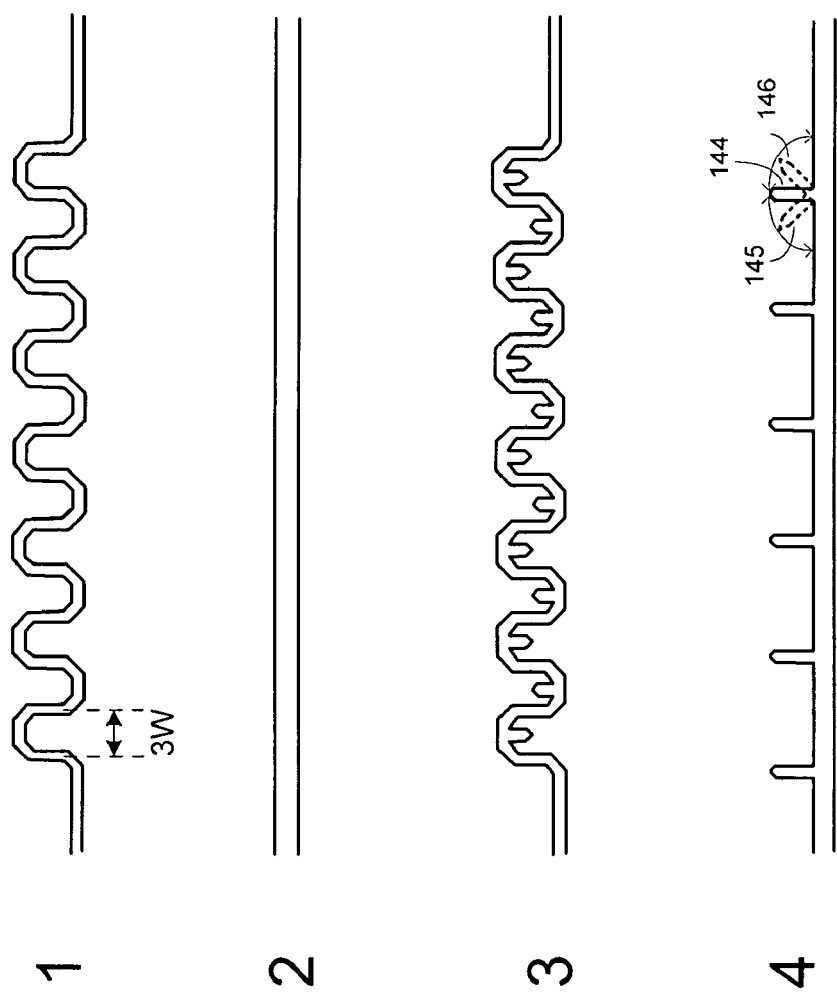
FIG. 5 is an illustration of a plurality of traces used to verify the effectiveness of the method and apparatus of the present invention.

The Traces 1-4 shown in FIG. 5 illustrate the type of patterns used in the simulation, but are not necessarily to scale and do not necessarily illustrate the total number of pattern features. In the actual simulation, Trace #1 had one inch of a snake-type serpentine consisting of twenty bends spaced at 3 w, Trace #2 was perfectly straight, Trace #3 was exactly like Trace #1 except comprised twenty compensation tabs of etch, 5 mil wide by 10 mil long inserted into the unused spaces, and Trace #4 was a straight trace with twenty compensation tabs 144 of the same geometry as Trace #3 spaced approximately 50 mil apart.

The results show Trace #1 to be approximately 18 ps faster than Trace #4 with no appreciable slew rate degradation or reflective artifacts on the edges themselves resulting from the compensation tabs. For the one inch of segment involved, this equates to about 125 mils of length difference. Further simulations showed the edges to be clean and monotonic regardless of trace length.

By properly adjusting the geometry, number and spacing of compensation tabs, a system designer can in effect tune the delay of a serpentine trace to match that of a non-serpentine trace and, more importantly, compensation tabs can be used to eliminate the number of required bends leading to more compact designs.

The compensation tabs may introduce slight impedance discontinuities; however, due to their short length and distributed nature, the impact on signal quality is very negligible. Also, due to their orientation, the compensation tabs seem to provide some guard-banding effect at higher frequencies when used within serpentine traces. While excellent results were obtained using compensation tabs oriented perpendicular to the longitudinal axis of the conductors, it is also possible to use compensation tabs at other angles, as illustrated by tabs 145 and 146 in Trace #4 of FIG. 5. Moreover, a combination of geometries including arcs or various cascading sizes can be used in a similar fashion.

Although the present invention has been described in detail, it should be understood that various changes, substitutions and alterations can be made hereto without departing from the spirit and scope of the invention as defined by the appended claims.

We claim:

1. A circuit board, comprising:
   a first conductor having a width (W) disposed between a first point and a second point of said circuit board; and
   a first plurality of compensation tabs having a generally uniform width equal to said width (W) on said conductor;
   wherein said first plurality of compensation tabs are operable to cause said conductor to have electrical conduction properties comparable to a conductor having a longer physical length than said first conductor.

2. The circuit board according to claim 1, further comprising a second conductor having said width W aligned substantially parallel to said first conductor, said second conductor having a second plurality of compensation tabs having said width W thereon,
   wherein said first plurality of compensation tabs and said second plurality of compensation tabs are aligned in an interleaved pattern in the area between said first and second conductors.

3. A method of forming a conductor on a circuit board, comprising:
   forming first conductor having a width (W) on said circuit board between a first point and a second point, thereof and
   forming a first plurality of compensation tabs having a generally uniform width equal to said width W on said first conductor;
   wherein said first plurality of compensation tabs are operable to cause said conductor to have electrical conduction properties comparable to a conductor having a longer physical length than said first conductor.

4. The method according to claim 3, further comprising:
   aligning a second conductor having said width W substantially parallel to said first conductor, said second conductor having a second plurality of compensation tabs having said width W thereon, wherein said first plurality of compensation tabs and said second plurality of compensation tabs are aligned in an interleaved pattern in the area between said first and second conductors.

5. An information handling system, comprising:
   at least one circuit board comprising information processing circuits and signal conductors, said circuit board further comprising:
   a first conductor having a width W disposed between a first point and a second point of said circuit board; and
   a first plurality of compensation tabs having a generally uniform width equal to said width W on said conductor;
   wherein said first plurality of compensation tabs are operable to cause said conductor to have electrical conduction properties comparable to a conductor having a longer physical length than said first conductor.

6. The information handling system according to claim 5, further comprising a second conductor having said width W aligned substantially parallel to said first conductor, said second conductor having a second plurality of compensation tabs having said width W thereon, wherein said first plurality of compensation tabs and said second plurality of compensation tabs are aligned in an interleaved pattern in the area between said first and second conductors.

7. A method of forming conductors in an information handling system, said information handling system including a circuit board comprising information processing circuits and a plurality of conductors, said method comprising:

forming first conductor having a width (W) on said circuit board between a first point and a second point, thereof and forming a first plurality of compensation tabs having a generally uniform width equal to said width W on said first conductor;

wherein said first plurality of compensation tabs are operable to cause said conductor to have electrical conduction properties comparable to a conductor having a longer physical length than said first conductor.

8. The method according to claim 7, further comprising:

aligning a second conductor having said width W substantially parallel to said first conductor, said second conductor having a second plurality of compensation tabs having said width W thereon, wherein said first plurality of compensation tabs and said second plurality of compensation tabs are aligned in an interleaved pattern in the area between said first and second conductors.

* * * * *